United States Patent [19]

Chen

[11] Patent Number: 5,477,180
[45] Date of Patent: Dec. 19, 1995

[54] CIRCUIT AND METHOD FOR GENERATING A CLOCK SIGNAL

[75] Inventor: Dao-Long Chen, Fort Collins, Colo.

[73] Assignees: AT&T Global Information Solutions Company, Dayton, Ohio; Hyundai Electronics America, Milpitas, Calif.; Symbios Logic Inc., Fort Collins, Colo.

[21] Appl. No.: 320,361

[22] Filed: Oct. 11, 1994

[51] Int. Cl.$^6$ .............................. G06F 1/04; G06G 7/12; H03K 17/16
[52] U.S. Cl. .................. 327/175; 327/291; 327/363; 327/391; 327/108
[58] Field of Search .................. 327/172, 173, 327/174, 175, 176, 291, 108, 113, 134, 137, 292, 362, 170, 299, 363, 378, 387, 391; 330/9

[56] References Cited

U.S. PATENT DOCUMENTS

| | | | |
|---|---|---|---|
| 3,571,627 | 3/1971 | Cardon | 327/119 |
| 3,612,901 | 10/1971 | Loe | 327/175 |
| 3,714,470 | 1/1973 | Goldberg | 327/175 |
| 3,740,588 | 6/1973 | Stratton et al. | 327/175 |
| 3,991,323 | 11/1976 | Przybylski | 327/31 |
| 4,527,075 | 7/1985 | Zbinden | 327/175 |
| 4,839,855 | 6/1989 | Van Driel | 327/292 |
| 4,876,463 | 10/1989 | Lyle | 327/175 |
| 4,959,557 | 9/1990 | Miller | 327/175 |
| 5,053,639 | 10/1991 | Taylor | 327/155 |
| 5,231,320 | 7/1993 | Kase | 327/277 |
| 5,315,164 | 5/1994 | Broughton | 327/175 |

Primary Examiner—Timothy P. Callahan
Assistant Examiner—Trong Phan
Attorney, Agent, or Firm—Wayne P. Bailey; Paul W. Martin

[57] ABSTRACT

A clock generator circuit which produces a clock signal which may have an adjustable steady state duty cycle and which has the same frequency as a crystal frequency. The clock generator circuit includes a drive circuit coupled to the crystal which converts the first signal to a clock signal, and a duty cycle control circuit which generates a feedback signal to cause the duty cycle to automatically change to the steady state duty cycle. The clock generator circuit of the present invention may also include an output pad for allowing a measuring instrument to determine the duty cycle.

12 Claims, 3 Drawing Sheets

CIRCUIT AND METHOD FOR GENERATING A CLOCK SIGNAL

BACKGROUND OF THE INVENTION

The present invention relates to circuits which generate clock signals, and more specifically to a circuit and method for generating a clock signal.

Digital systems typically require one or more clock signals which synchronize activities performed by different functional parts within the systems. It is desirable in such systems that the clock signals have fifty percent duty cycles. The term "duty cycle" is well known to mean the ratio of pulse width to total cycle time. Thus, for a fifty percent duty cycle clock signal, the clock signal is high for half the cycle time.

Known methods of generating a clock signal having a fifty percent duty cycle involve generating a signal having a frequency equal to twice the desired frequency and dividing the signal by two to remove any duty cycle distortion.

These methods suffer from high cost. For example, a 100 MHz crystal is more expensive than a 50 MHz crystal. These systems also consume high amounts of power, produce high amounts of radio frequency (RF) radiation, and degrade system performance. Finally, they produce clock signals whose duty cycles are difficult to measure during production testing.

Therefore, it would be desirable to provide a circuit and method for generating a clock signal which do not suffer from the disadvantages above. It would also be desirable that the circuit and method produce a clock signal having a steady state duty cycle which is not limited to fifty percent.

SUMMARY OF THE INVENTION

In accordance with the teachings of the present invention, a circuit and method for generating a clock signal are provided. The clock generator circuit includes a crystal which generates a first signal having a frequency, and a control circuit coupled to the crystal converts the first signal into a clock signal which has the same frequency as the first signal and which has a duty cycle and a steady state duty cycle.

Thus, it is a feature of the present invention that the crystal frequency and the clock frequency are the same; no frequency divider is required.

The control circuit includes a drive circuit coupled to the crystal which converts the first signal to a clock signal and which has a clock signal output and a feedback signal input, and a duty cycle control circuit, which is coupled between the clock signal output and the feedback signal input, and which generates the feedback signal to cause the duty cycle to automatically change to the steady state duty cycle.

Thus, it is a feature of the present invention that variations from a steady state duty cycle are automatically corrected.

The clock generator circuit of the present invention may also include a circuit element which changes the steady state duty cycle to a new steady state duty cycle. The steady state duty cycle may be changed without changing the circuit.

Finally, the clock generator circuit may also include an output pad for allowing a measuring instrument to determine the duty cycle.

It is accordingly an object of the present invention to provide a circuit and method for generating a clock signal.

It is another object of the present invention to provide a circuit and method for generating a clock signal which do not use a frequency divider.

It is another object of the present invention to provide a circuit and method for generating a clock signal which has the same frequency as a crystal within the circuit.

It is another object of the present invention to provide a circuit and method for generating a clock signal which automatically adjusts the duty cycle to a steady state duty cycle.

It is another object of the present invention to provide a circuit and method for generating a clock signal in which the steady state duty cycle is adjustable without modification to the circuit.

It is another object of the present invention to provide a circuit and method for generating a clock signal which provides for measurement of the duty cycle.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings, in which:

DETAILED DESCRIPTION OF THE PREFERRED EMBODIMENT

Figure 1:
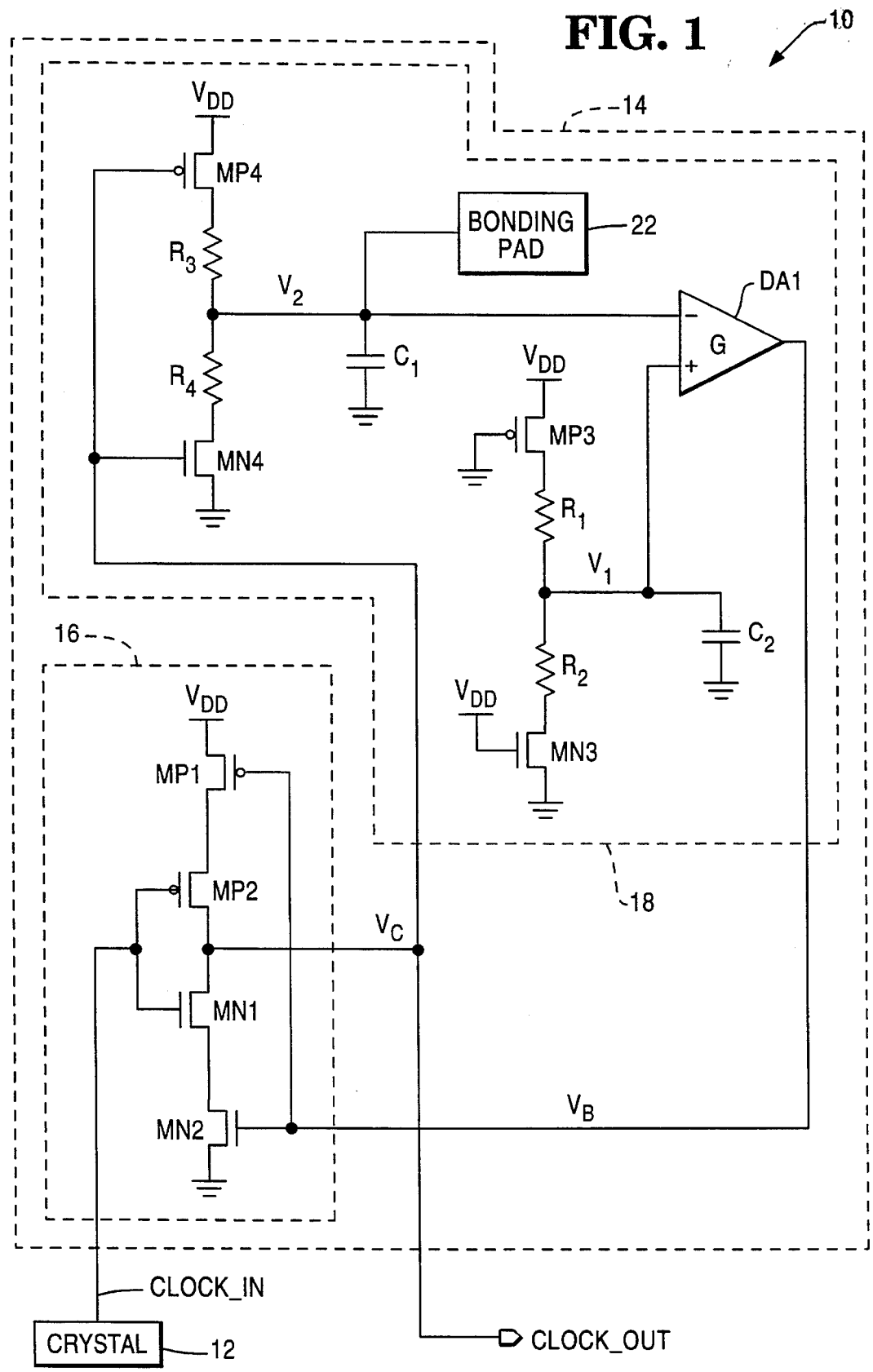
FIG. 1 is a diagram of the circuit of the present invention.

Referring now to FIG. 1, clock signal generator 10 includes crystal 12 and control circuit 14.

Crystal 12 produces a signal CLOCK_IN to control circuit 14. Signal CLOCK_IN is substantially constant in frequency.

Control circuit 14 includes driver circuit 16 and duty cycle control circuit 18.

Driver circuit 16 amplifies signal CLOCK_IN, converts signal CLOCK_IN to signal CLOCK_OUT, and adjusts the duty cycle of signal CLOCK_OUT in response to control signals from duty cycle control circuit 18. Driver circuit 16 includes field effect transistors (FETs) MP1, MP2, MN1, and MN2, which are connected in series between Vdd and ground. FETs MP1 and MP2 are p-channel FETs. FETs MN1 and MN2 are n-channel FETs. The gates of FETs MP2 and MN1 are also connected with each other and with an input terminal providing signal CLOCK_IN. A center tap between FETs MP2 and MN1 provides output clock signal CLOCK_OUT. The gates of FETs MP1 and MN2 are connected together and to a bias voltage Vb from duty cycle control circuit 18.

Duty cycle control circuit 18 monitors the voltage Vc of signal CLOCK_OUT at the connection of FETs MN1 and MP2 and produces bias voltage Vb at the gates of FETs MP1 and MN2 to control the duty cycle of signal CLOCK_OUT.

Figure 2:
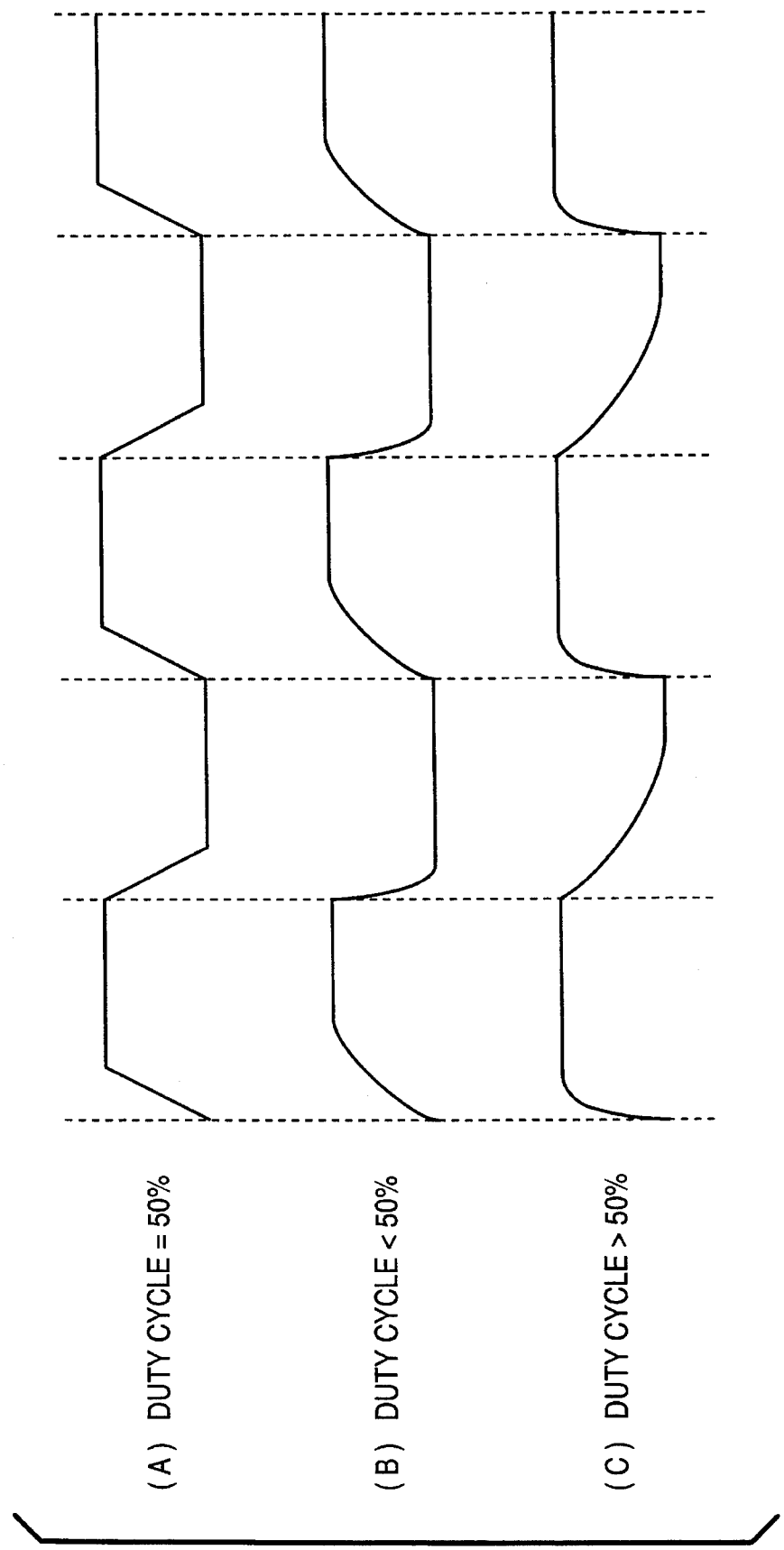
FIGS. 2(A), 2(B) and 2(C) are a waveform diagram illustrating the operation of the circuit of the present invention.

With reference to FIGS. 2(A), 2(B) and 2(C), the following can be said about the relationship between bias voltage Vb and voltage Vdd for a fifty percent duty cycle:

1. When bias voltage Vb is half of voltage Vdd, the charge current through FETs MP1 and MP2 is the same as the discharge current through FETs MN1 and MN2. The rise and fall times of signal CLOCK_OUT are the same and a fifty percent duty cycle results (waveform (a)).

2. When bias voltage Vb is larger than half of voltage Vdd, the charge current is smaller than the discharge current. The rise time is greater than the fall time and a less than fifty percent duty cycle results (waveform (b)).

3. When bias voltage Vb is smaller than half of voltage Vdd, the charge current is larger than the discharge current. The rise time is less than the fall time and a greater than fifty percent duty cycle results (waveform (c)).

Referring back to FIG. 1, duty cycle control circuit 18 includes differential amplifier DA1, and resistors R1-R4, FETs MN3, MP3, MN4, and MP4, and capacitors C1 and C2. Differential amplifier DA1 has a gain G.

Resistors R1 and R2, FETs MN3 and MP3, and capacitor C2 form a first adjustment circuit which is connected between ground and a first input of amplifier DA1. Resistors R1 and R2, and FETs MN3 and MP3 are connected in series between voltage Vdd and ground. A tap point between resistors R1 and R2 provides voltage V1 to amplifier DA1. The gate of FET MP3 is connected to ground. The gate of MN3 is connected to voltage Vdd.

Capacitor C1 is a decoupling capacitor which filters out any noise from voltage Vdd and ground and reduces any overshoot in feedback response.

Resistors R3 and R4, FETs MN4 and MP4, and capacitor C1 form a second adjustment circuit which is connected between the output clock terminal of driver circuit 16 and a second input of amplifier DA1. Resistors R3 and R4, and FETs MN4 and MP4 are connected in series between voltage Vdd and ground. A tap point between resistors R3 and R4 provides voltage V2 to amplifier DA1. The gates of FETs MP4 and MN4 are connected with each other and with the output clock terminal of driver circuit 16.

Capacitor C2 is a decoupling capacitor which filters out any noise from voltage Vdd and ground and reduces any overshoot in feedback response.

Bias voltage Vb is determined by the input voltages of differential amplifier DA1:

$$Vb = Vdd/2 + G(V1-V2)$$

If the resistances of FETs MP3 and MN3 are much smaller than resistors R1 and R2, and the resistances of FETs MP4 and MN4 are much smaller than resistors R3 and R4, then voltages V1 and V2 are determined by the following equations:

$$V1 = Vdd \cdot R2/(R1+R2),$$

$$V2 = Vdd \cdot R4/(R3+R4).$$

For a fifty percent duty cycle, resistor R1 equals resistor R2 and resistor R3 equals resistor R4. Thus, $$V1 = V2 = Vdd/2$$

The amounts of charge being transported from voltage Vdd to voltage V2 and from voltage V2 to ground during each clock cycle are:

$$Q1 = [(Vdd-V2)/R3] \cdot T \cdot (1-D),$$

$$Q2 = [(V2-0)/R4] \cdot T \cdot D,$$

where T is the clock cycle time and D is the duty cycle of signal CLOCK_OUT.

Charge Q1 equals charge Q2 under steady state conditions. Thus, $$V2 = (1-D) \cdot Vdd.$$

Thus, voltage V2 is directly proportional to (1-D) of signal CLOCK_OUT. Since V1=V2=Vdd/2 for R1=R2 and R3=R4, the duty cycle D must equal fifty percent.

Advantageously, duty cycle control circuit 18 is capable of generating a fifty percent duty cycle without using an expensive crystal, having a frequency of twice the clock frequency, in combination with a divide-by-two circuit.

It is a feature of the present invention that duty cycle control circuit 18 seeks a steady state duty cycle D. If the instantaneous duty cycle were larger than D, voltage V2 would be smaller than V1. Consequently, bias voltage Vb would be larger than D·Vdd, which, in turn, would reduce the duty cycle towards D.

It is another feature of the present invention that duty cycle control circuit 18 may also be used to adjust the steady state duty cycle D to any number other than fifty percent. Steady state duty cycle D may be adjusted by adjusting resistors R1-R4 as follows:

$$R3 = R4 \text{ and}$$

$$R2 = (1-D)(R1+R2)$$

If the desired duty cycle D is very much larger or smaller than fifty percent, several adjustment circuits may be cascaded to achieve the desired duty cycle D without suffering from a very slow rise or fall time.

Finally, it is another feature of the present invention that duty cycle control circuit 18 provides an easy and cost-effective way to determine the duty cycle D of signal CLOCK_OUT. Since voltage V2 is directly proportional to (1-D) and voltage Vdd is known, duty cycle D is determined by measuring voltage V2 at bonding pad 22.

Figure 3:
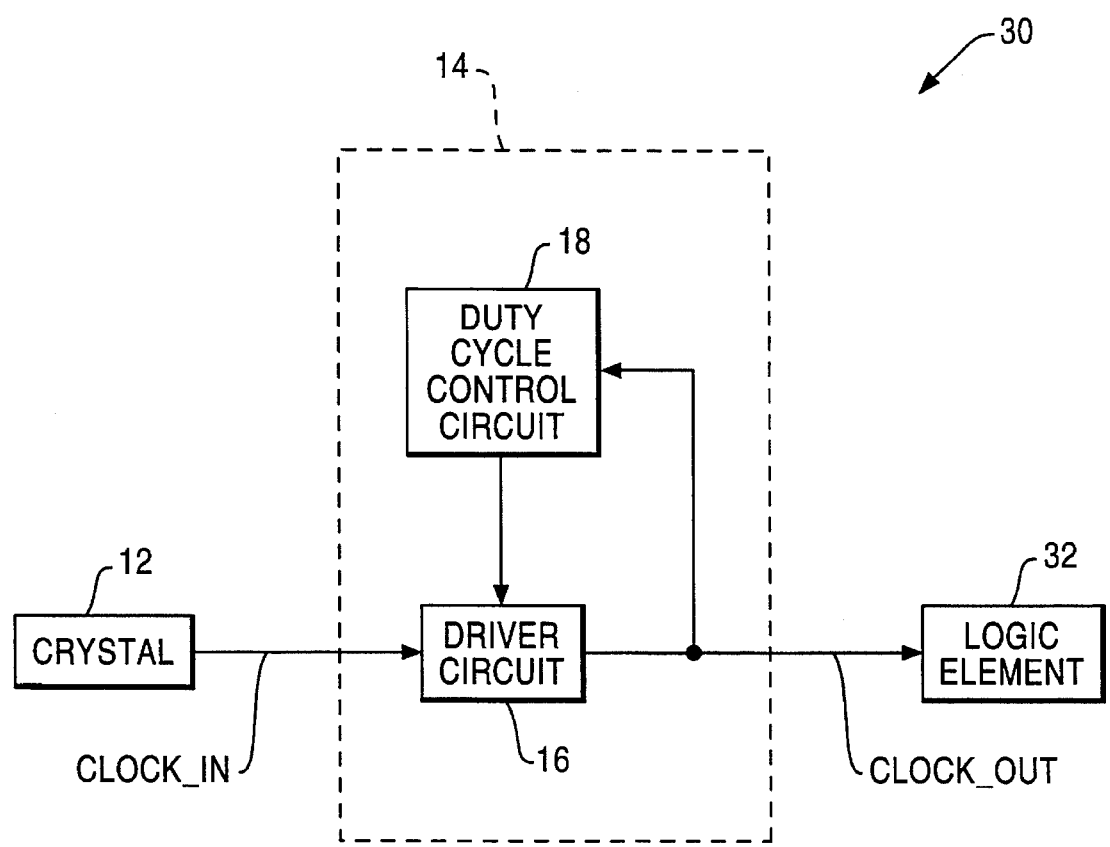
FIG. 3 is a block diagram of a system incorporating the circuit of the present invention.

Referring to FIG. 3, control circuit 14 of the present invention is suited for use within any system 30 within a computer. System 30 also includes a logic element 32 which employs signal CLOCK_OUT.

Although the present invention has been described with particular reference to certain preferred embodiments thereof, variations and modifications of the present invention can be effected within the spirit and scope of the following claims.

I claim:

1. A clock signal generator circuit comprising:

a crystal which generates a first signal having a frequency;

a drive circuit coupled to the crystal, including a first circuit having a clock signal output and which converts the first signal from the crystal to a clock signal, and a second circuit coupled to the first circuit and having a feedback signal input which applies a feedback signal to control a duty cycle of the clock signal;

wherein the first circuit comprises a first field effect transistor and a second field effect transistor, the first field effect transistor having a gate, a source, and a drain, wherein the gate of the first field effect transistor is coupled to the crystal to receive the first signal, the second field effect transistor having a gate, a source, and a drain, wherein the drain of the second field effect transistor is coupled to the drain of the first field effect transistor at the clock signal output which provides the clock signal, and wherein the gate of the second field effect transistor is coupled to the crystal to receive the first signal; and a duty cycle control circuit, which is coupled between the clock signal output to receive the clock signal and the feedback signal input, and which generates the feedback signal to cause the duty cycle of the clock signal to automatically change to a steady state duty cycle.

2. The clock signal generator circuit as recited in claim 1, wherein the steady state duty cycle is adjustable to a new steady state duty cycle in response to a new feedback signal.

3. The clock signal generator circuit as recited in claim 1, wherein the steady state duty cycle is fifty percent.

4. The clock generator circuit as recited in claim 1, wherein the second circuit comprises:

a third field effect transistor having a gate, a source, and a drain, wherein the drain of the third field effect transistor is coupled to the source of the first field effect transistor, wherein the source of the third field effect transistor is coupled to a voltage source, and wherein the gate of the third field effect transistor is coupled to the feedback signal; and a fourth field effect transistor having a gate, a source, and a drain, wherein the source of the fourth field effect transistor is coupled to a ground, wherein the drain of the fourth field effect transistor is coupled to the source of the second field effect transistor, and wherein the gate of the fourth field effect transistor is coupled to the gate of the third field effect transistor.

5. The clock signal generator circuit as recited in claim 1, wherein the duty cycle control circuit comprises:

a circuit element which generates a new feedback signal to change the steady state duty cycle to a new steady state duty cycle.

6. A clock signal generator circuit comprising:

a crystal which generates a first signal having a frequency;

a drive circuit coupled to the crystal, including a first circuit having a clock signal output and which converts the first signal from the crystal to a clock signal, and a second circuit coupled to the first circuit and having a feedback signal input which applies a feedback signal to control a duty cycle of the clock signal; and a duty cycle control circuit, which is coupled between the clock signal output to receive the clock signal and the feedback signal input, and which generates the feedback signal to cause the duty cycle of the clock signal to automatically change to a steady state duty cycle, wherein the duty cycle control circuit comprises an output pad for allowing a measuring instrument to determine the duty cycle.

7. A clock signal generator circuit comprising:

a crystal which generates a first signal having a frequency;

a drive circuit coupled to the crystal, including a first circuit having a clock signal output and which converts the first signal from the crystal to a clock signal, and a second circuit coupled to the first circuit and having a feedback signal input which applies a feedback signal to control a duty cycle of the clock signal; and a duty cycle control circuit which is coupled to the drive circuit means for receiving the clock signal and providing the feedback signal to cause the duty cycle of the clock signal to automatically change to a steady state duty cycle, the duty cycle control circuit comprising:

a first voltage divider coupled to the clock signal output including first and second resistors connected in series which produce a first output voltage at a connection point between the first and second resistors, a first transistor switch, which is coupled between the first resistor and a voltage source, and which is closed when the clock signal is in a low state, and a second transistor switch which is coupled between the second resistor and a ground and which is closed when the clock signal is in a high state;

a second voltage divider including third and fourth resistors connected in series between the voltage source and the ground which produce a second output voltage at a connection point between the third and fourth resistors; and a differential amplifier having first and second inputs coupled to the first and second output voltages and an output coupled to the feedback signal input of the second circuit, wherein the first and second voltage dividers and the differential amplifier produce the feedback signal to cause the duty cycle of the clock signal to automatically change to the steady state duty cycle.

8. The clock generator as recited in claim 7, wherein the duty cycle control circuit further comprises:

a first capacitor coupled between the connection point between the first and second resistors and the ground for removing noise from the first output signal and reducing feedback overshoot in the first output signal; and a second capacitor coupled between the connection point between the third and fourth resistors and the ground for removing noise from the second output signal and reducing feedback overshoot in the second output signal.

9. A clock generator circuit comprising:

a crystal which generates a first signal having a frequency;

a drive circuit coupled to the crystal, which converts the first signal to a clock signal, and which has a clock signal output and a feedback signal input, wherein the drive circuit includes a first field effect transistor having a gate, a source, and a drain, wherein the gate is coupled to the crystal;

a second field effect transistor having a gate, a source, and a drain, wherein the drain of the second field effect transistor is coupled to the drain of the first field effect transistor at a connection point which provides the clock output signal, and wherein the gate is coupled to the crystal;

a third field effect transistor having a gate, a source, and a drain, wherein the drain of the third field effect transistor is coupled to the source of the first field effect transistor, wherein the source of the third field effect transistor is coupled to a voltage source, and wherein the gate of the third field effect transistor is coupled to the feedback signal; and a fourth field effect transistor having a gate, a source, and a drain, wherein the source of the fourth field effect transistor is coupled to a ground, wherein the drain of the fourth field effect transistor is coupled to the source of the second field effect transistor, and wherein the gate of the fourth field effect transistor is coupled to the gate of the third field effect transistor; and a duty cycle control circuit, which is coupled between the clock signal output and the feedback signal input, and which generates the feedback signal to cause the duty cycle to automatically change to a steady state duty cycle, including a circuit element which changes the steady state duty cycle to a new steady state duty cycle.

10. The clock generator as recited in claim 9, wherein the duty cycle control circuit further comprises:

an output pad for allowing a measuring instrument to determine the duty cycle.

11. A clock signal generator circuit comprising:

a crystal which generates a first signal having a frequency;

drive circuit means coupled to the crystal for converting the first signal from the crystal to a clock signal, for receiving a feedback signal, and for varying a duty cycle of the clock signal in response to the feedback signal; and a duty cycle control circuit coupled to the drive circuit means for receiving the clock signal and providing the feedback signal to cause the duty cycle of the clock signal to automatically change to a steady state duty cycle, the duty cycle control circuit comprising:

a first voltage divider including first and second resistors connected in series which provide a first output voltage at a connection point between the first and second resistors, and first and second switches which alternately provide voltage from a voltage source to the first resistor when the clock signal is in a first state and provide voltage from the second resistor to a ground when the clock signal is in a second state that is different from the first state; and feedback means for receiving the first output voltage from the first voltage divider and for generating the feedback signal used to cause the duty cycle of the clock signal to automatically change to the steady state duty cycle.

12. A clock signal generator circuit comprising:

a crystal which generates a first signal having a frequency;

drive circuit means coupled to the crystal for converting the first signal from the crystal to a clock signal, for receiving a feedback signal, and for varying a duty cycle of the clock signal in response to the feedback signal; and a duty cycle control circuit coupled to the drive circuit means for receiving the clock signal and providing the feedback signal to cause the duty cycle of the clock signal to automatically change to a steady state duty cycle, the duty cycle control circuit comprising:

a voltage divider including first and second resistors connected in series which provide an output voltage at a connection point between the first and second resistors;

switch means for coupling the voltage divider to a voltage source for use in providing a first and a second voltage independent of the amplitude of the clock signal and for switching application of voltage to the voltage divider between the first voltage when the clock signal is in a high state and the second voltage when the clock signal is in a low state; and feedback means for receiving the output voltage from the voltage divider and for generating the feedback signal used to cause the duty cycle of the clock signal to automatically change to the steady state duty cycle.

* * * * *